United States Patent
Lee (10) Patent No.: US 11,803,022 B2
(45) Date of Patent: Oct. 31, 2023

(54) CIRCUIT BOARD STRUCTURE WITH WAVEGUIDE AND METHOD FOR MANUFACTURING THE SAME

(71) Applicant: BOARDTEK ELECTRONICS CORPORATION, Taoyuan (TW)

(72) Inventor: Chien-Cheng Lee, New Taipei (TW)

(73) Assignee: BOARDTEK ELECTRONICS CORPORATION, Taoyuan (TW)

( * ) Notice: Subject to any disclaimer, the term of this patent is extended or adjusted under 35 U.S.C. 154(b) by 51 days.

(21) Appl. No.: 17/412,536

(22) Filed: Aug. 26, 2021

(65) Prior Publication Data

US 2023/0027319 A1    Jan. 26, 2023

(30) Foreign Application Priority Data

Jul. 22, 2021   (TW) .................................. 110127060

(51) Int. Cl.
  *G02B 6/42*   (2006.01)
  *H05K 1/02*   (2006.01)

(52) U.S. Cl.
  CPC ........... *G02B 6/428* (2013.01); *H05K 1/0216* (2013.01); *H05K 2201/10121* (2013.01)

(58) Field of Classification Search
  CPC ................ G02B 6/428; H05K 1/0216; H05K 2201/10121
  See application file for complete search history.

(56) References Cited

U.S. PATENT DOCUMENTS

| | | | | |
|---|---|---|---|---|
| 6,744,961 B2* | 6/2004 | Horishita | ............... | G02B 6/426 385/136 |
| 7,508,006 B2* | 3/2009 | Hsu | ........................ | H01L 24/16 257/432 |
| 7,519,244 B2* | 4/2009 | Hsu | .......................... | G02B 6/43 372/36 |
| 7,630,592 B2* | 12/2009 | Neyer | ...................... | G02B 6/43 385/132 |
| 7,991,248 B2* | 8/2011 | Matsuoka | ................ | G02B 6/43 385/132 |
| 8,488,920 B2* | 7/2013 | Pitwon | ................. | H05K 1/0274 359/341.3 |
| 8,708,576 B2* | 4/2014 | Shacklette | ............... | G02B 6/42 385/33 |
| 9,116,292 B2* | 8/2015 | Fujiwara | .............. | G02B 6/4214 |
| 10,251,258 B2* | 4/2019 | Herbsommer | ......... | H05K 1/025 |
| 11,493,711 B2* | 11/2022 | Shen | .................... | G02B 6/4281 |

(Continued)

*Primary Examiner* — Andrew Jordan
(74) *Attorney, Agent, or Firm* — ScienBiziP, P.C.

(57) ABSTRACT

A method for manufacturing a circuit board structure with a waveguide is provided. The method includes: providing a plate including a top wall and sidewalls disposed on the top wall, an opening being defined between ends of two adjacent sidewalls away from the top wall; forming a conductive layer on the plate to obtain a conductive plate; providing a circuit board, the circuit board comprising an outer circuit layer; mounting the conductive plate on the outer circuit layer, causing the outer circuit layer to be disposed on the opening. The two adjacent sidewalls, the top wall between the two adjacent sidewalls, and the circuit board between the two adjacent sidewalls cooperatively constitutes a tube body of the waveguide, and the conductive layer and the outer circuit layer on an inner surface of the tube body cooperatively constitute a shielding of the waveguide.

11 Claims, 14 Drawing Sheets

(56) References Cited

U.S. PATENT DOCUMENTS

| | | | | |
|---|---|---|---|---|
| 2003/0133685 A1* | 7/2003 | Horishita | ............... | G02B 6/426 |
| | | | | 385/134 |
| 2007/0086695 A1* | 4/2007 | Hsu | ........................ | H01L 24/16 |
| | | | | 385/14 |
| 2007/0104412 A1* | 5/2007 | Hsu | ........................ | G02B 6/43 |
| | | | | 385/14 |
| 2010/0166363 A1* | 7/2010 | Matsuoka | .......... | G02B 6/12002 |
| | | | | 385/14 |
| 2010/0232744 A1* | 9/2010 | Asai | ........................ | G02B 6/43 |
| | | | | 385/14 |
| 2012/0051686 A1* | 3/2012 | Pitwon | ................. | H05K 1/0274 |
| | | | | 264/1.27 |
| 2012/0189253 A1* | 7/2012 | Shacklette | ............... | G02B 6/43 |
| | | | | 264/1.28 |
| 2013/0177277 A1* | 7/2013 | Fujiwara | ................. | G02B 6/32 |
| | | | | 264/1.24 |
| 2013/0182997 A1* | 7/2013 | Fujiwara | .............. | G02B 6/4214 |
| | | | | 277/316 |
| 2013/0209028 A1* | 8/2013 | Fujiwara | ................. | G02B 6/43 |
| | | | | 385/14 |
| 2015/0109812 A1* | 4/2015 | Greb | .................... | H05K 7/1481 |
| | | | | 362/555 |
| 2018/0292078 A1* | 10/2018 | Zheng | ................. | G02B 6/4274 |
| 2021/0356682 A1* | 11/2021 | Shen | ........................ | G02B 6/4214 |
| 2023/0027319 A1* | 1/2023 | Lee | ........................ | H01P 3/121 |

\* cited by examiner

CIRCUIT BOARD STRUCTURE WITH WAVEGUIDE AND METHOD FOR MANUFACTURING THE SAME

FIELD

The subject matter herein generally relates to waveguides, and more particularly, to a circuit board structure with a waveguide and a method for manufacturing the circuit board structure.

BACKGROUND

Substrate Integrated Waveguide (SIW) is a new type of transmission line structure that can be integrated into a dielectric substrate. The SIW can be obtained by forming metallic layers on both sides of the dielectric substrate and drilling two arrays of metallic conductive holes in the dielectric substrate. The two arrays of metallic conductive holes can be equivalent to two metallic walls, and the transmission characteristics therebetween can be characterized as a rectangular waveguide.

However, the number of the metallic conductive holes may be very large, and the metallic conductive holes should have a high position accuracy, which lead to a high cost. Moreover, transmission loss may generate when microwaves is transmitted within the SIW. Improvement in the art is desired.

BRIEF DESCRIPTION OF THE DRAWINGS

Implementations of the present technology will now be described, by way of embodiment, with reference to the attached figures.

FIGS. 1A to 4 are diagrammatic views of an embodiment of a method for manufacturing a circuit board structure according to the present disclosure.

DETAILED DESCRIPTION

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure.

The term "comprising," when utilized, means "including, but not necessarily limited to"; it specifically indicates open-ended inclusion or membership in the so-described combination, group, series, and the like.

Figure 8:
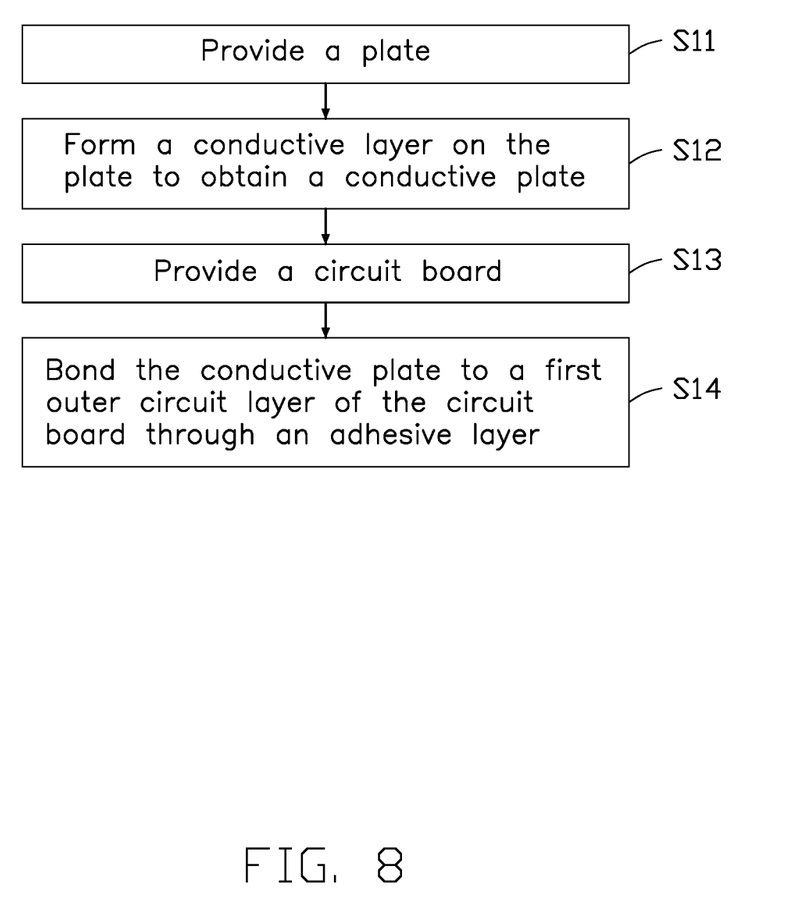
FIG. 8 is a flowchart of an embodiment of a method for manufacturing a circuit board structure according to the present disclosure.

Referring to FIG. 8, a method for manufacturing a circuit board structure 1 (shown in FIG. 4) is presented in accordance with an embodiment. The circuit board structure 1 can be used in a radar system (such as an automotive millimeter wave radar). The method is provided by way of example, as there are a variety of ways to carry out the method. The method can begin at S11.

Figure 1A:
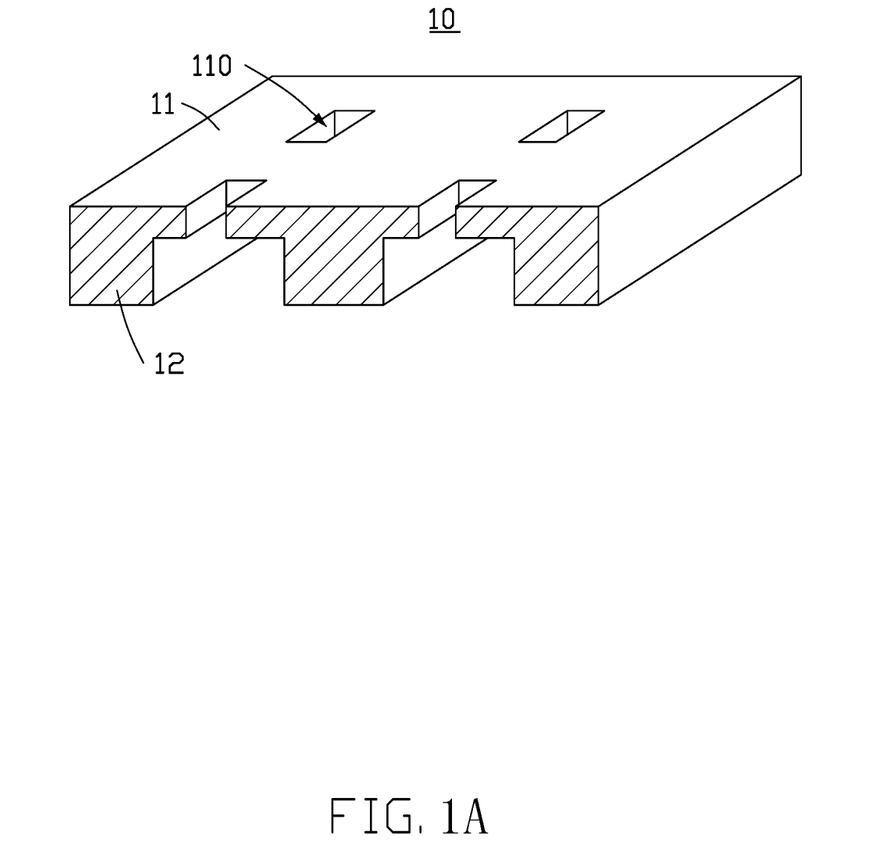
Figure 1B:
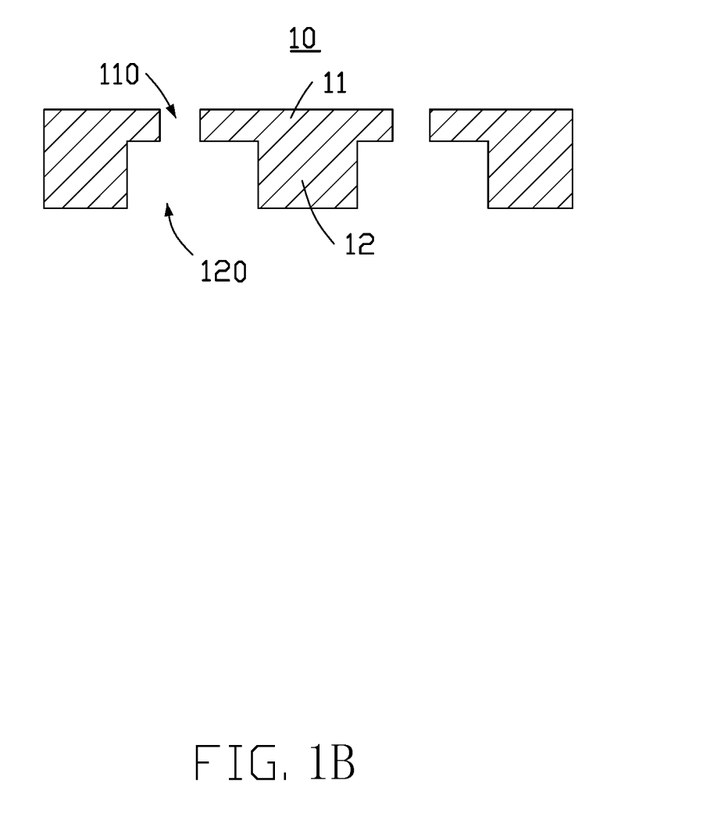

Step S11, referring to FIGS. 1A and 1B, a plate 10 is provided. The plate 10 includes a top wall 11 and a plurality of sidewalls 12 on a same surface of the top wall 11. The sidewalls 12 are spaced apart from each other.

The top wall 11 includes a plurality of notches 110, and each notch 110 communicates with a space between two adjacent sidewalls 12. An opening 120 is defined between ends of two adjacent sidewalls 12 away from the top wall 11.

In some embodiments, the plate 10 can be formed by injection molding or die casting.

In this embodiment, the plate 10 is prepared by injection molding. The plate 10 is made of a thermoplastic polymer. The thermoplastic polymer can be a material that is resistant to high temperatures and has a low thermal expansion coefficient, such as polyolefin.

Figure 2:
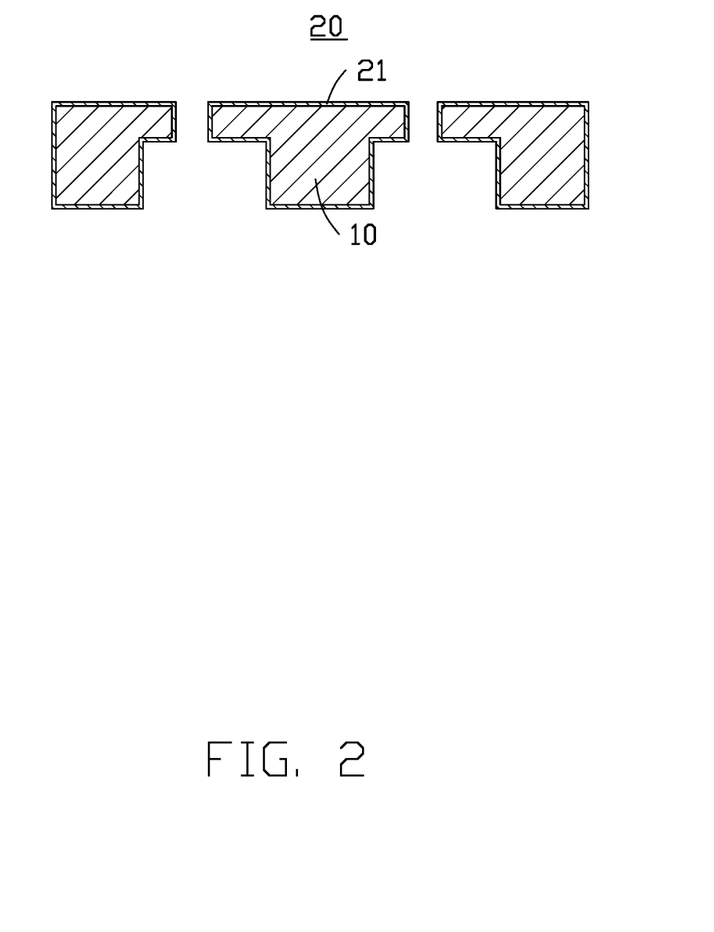

Step S12, referring to FIG. 2, a conductive layer 21 is formed on the plate 10 to obtain a conductive plate 20. In the conductive plate 20, the conductive layer 21 at least covers the inner surfaces of the plate 10.

In some embodiments, the conductive layer 21 covers the inner surface and the outer surface of the plate 10.

In some embodiments, the conductive layer 21 includes at least one metal such as copper, gold, and silver. The conductive layer 21 can be formed by electroplating, chemical vapor deposition, or printing.

Figure 3:
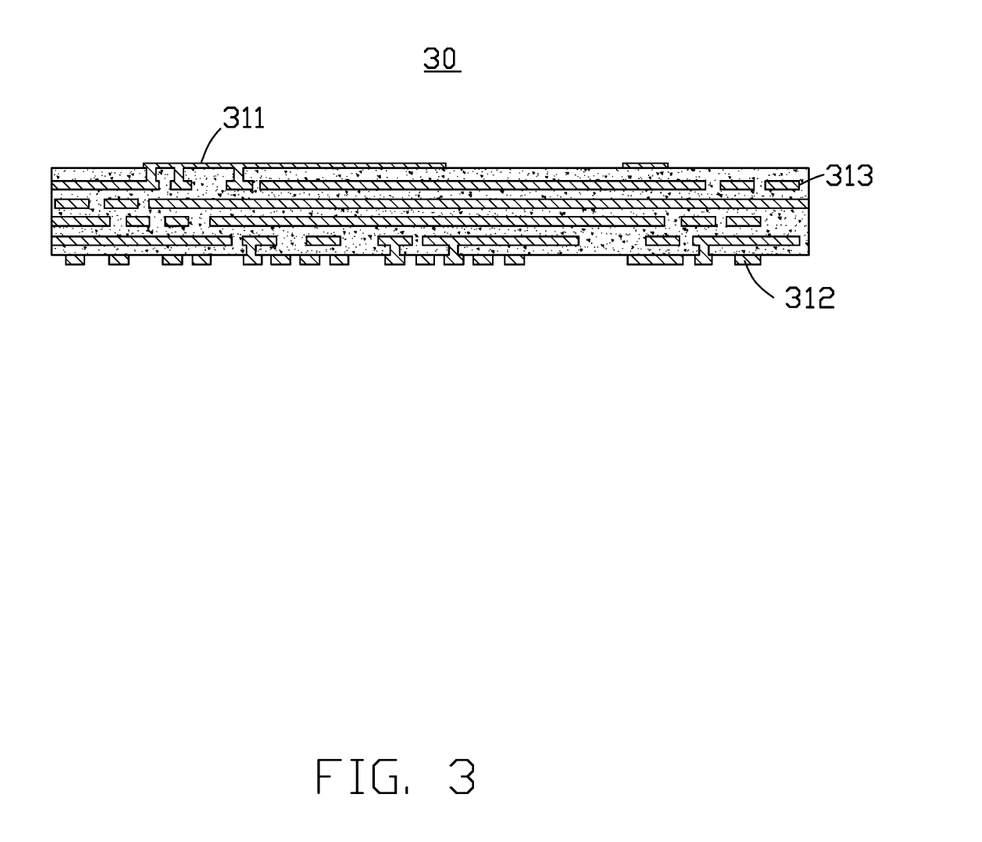

Step S13, referring to FIG. 3, a circuit board 30 is provided.

In some embodiments, the circuit board 30 includes a first outer circuit layer 311, a second outer circuit layer 312, and at least one inner circuit layer 313. As shown in FIG. 3, the circuit board 30 of this embodiment may include five inner circuit layers 313. That is, the circuit board 30 includes seven circuit layers in total. However, in other embodiments, the number of circuit layers of the circuit board 30 is not limited, and can also be set as needed.

Figure 4:
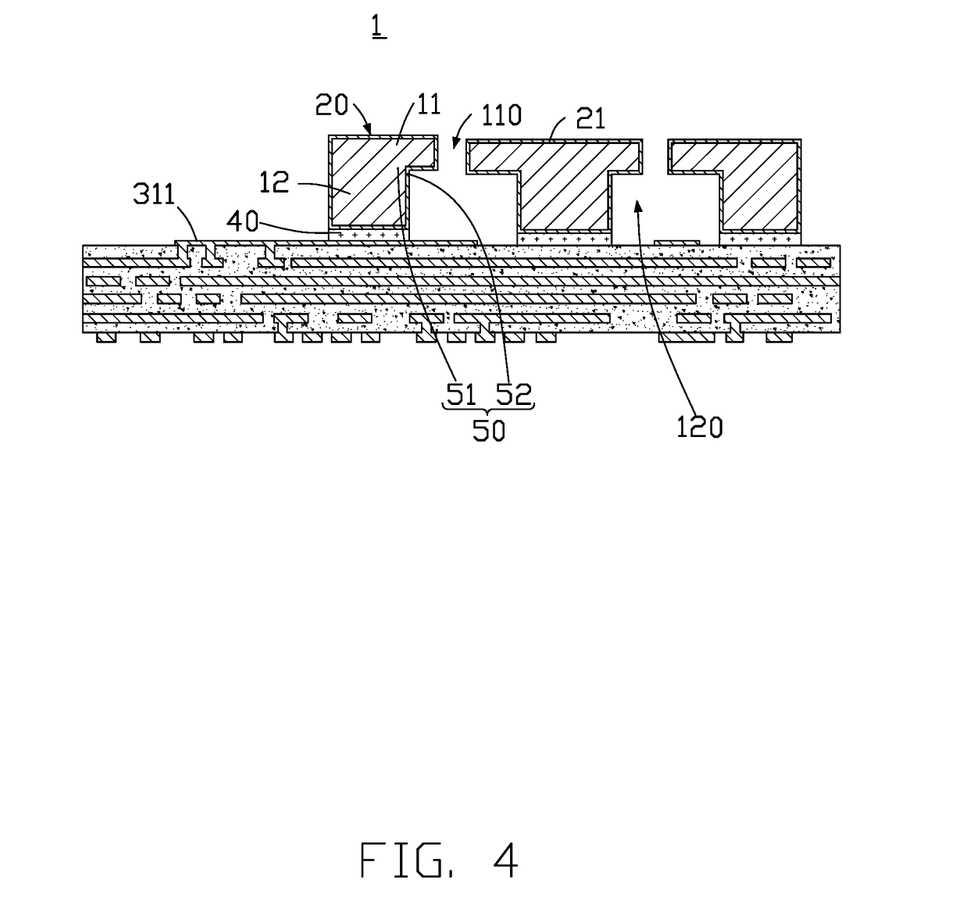

Step S14, referring to FIG. 4, the conductive plate 20 is bonded to the first outer circuit layer 311 through an adhesive layer 40 that made of a conductive material, causing the notches 110 of the conductive plate 20 to face outward (that is, the first outer circuit layer 311 is disposed on the opening 120), thereby obtaining the circuit board structure 1.

In some embodiments, the adhesive layer 40 may be made of a conductive paste (such as copper paste) or a conductive resin. The adhesive layer 40 can further reflect electromagnetic waves.

The two adjacent sidewalls 12, the top wall 11 between the two sidewalls 12, and the circuit board 30 between the two sidewalls 12 cooperatively constitute a tube body 51 of a waveguide 50, and the conductive layer 21 and the first outer circuit layer 311 on the inner surface of the tube body 51 cooperatively constitute a shielding layer 52 of the waveguide 50, so that the electromagnetic waves (signal waves) can propagate in the waveguide 50. As shown in FIG. 4, the circuit board structure 1 includes two waveguides 50 in total. The notches 110 provided on the top wall 11 allow the electromagnetic waves propagated in the waveguide 50 to radiate to the outside environment, or allow the electromagnetic waves that are reflected back when encountering an object to be introduced into the waveguide 50. Since the medium in the waveguide 50 is air, that is, the electromagnetic waves propagate in the air, so transmission loss of the electromagnetic waves can be reduced. On the other hand, when the plate 10 is formed by injection molding, the waveguide 50 can have an accurate size and shape, and also have a smooth surface, which can further reduce the transmission loss of the electromagnetic waves. At the same time, since the adhesive layer 40 that made of conductive material is between the conductive plate 20 and the first outer circuit layer 311, the adhesive layer 40 can prevent the electromagnetic waves from being leaked out through the junction of the conductive plate 20 and the first outer circuit layer 311 during transmission.

Figure 5:
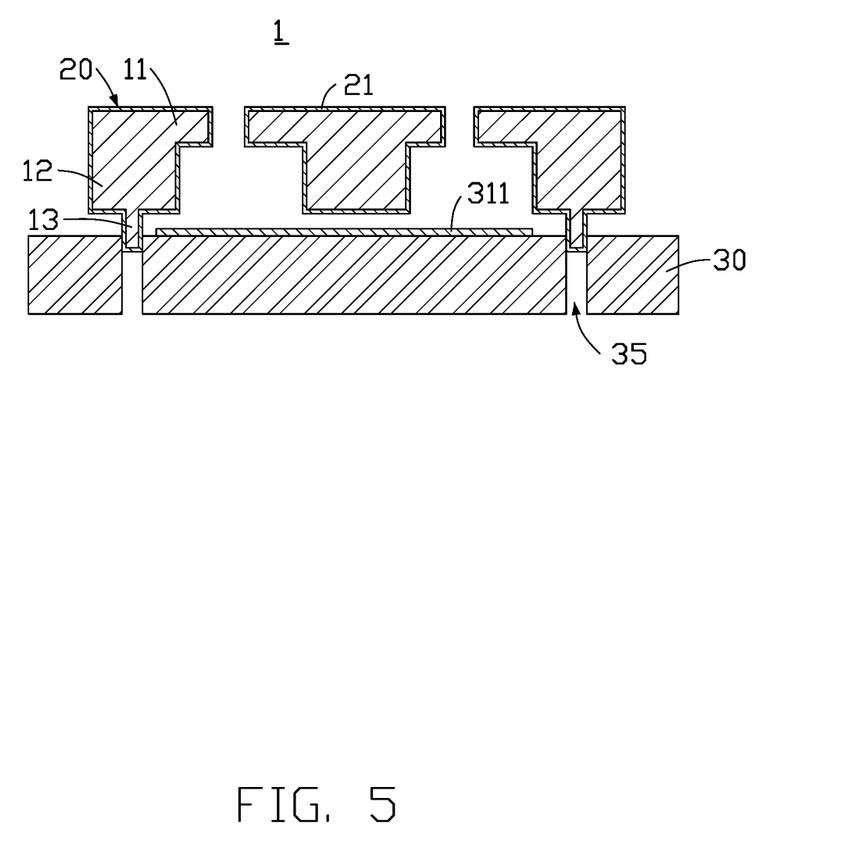
FIG. 5 is a diagrammatic view wherein a conductive plate and a circuit board are connected in another embodiment.

In other embodiments, the adhesive layer 40 may also be omitted. Referring to FIGS. 3 and 5, the circuit board 30 defines a plurality of conductive holes 35, and each conductive hole 35 can electrically connect the first outer circuit layer 311, the second outer circuit layer 312, and the inner circuit layer 313 together. In such case, the end of the sidewall 12 of the plate 10 away from the top wall 11 is provided with a positioning pillar 13, and the conductive layer 21 can also be formed on the positioning pillar 13. The positioning pillar 13 may be integrally formed with the top wall 11 and the sidewalls 12 during injection molding.

In such case, in step S14, the positioning pillar 13 of the conductive plate 20 can be directly inserted into the conductive hole 35 of the circuit board 30. That is, the conductive hole 35 of the circuit board 30 itself can be fully used to install the conductive plate 20, thus, the adhesive layer 40 can be omitted.

Figure 6:
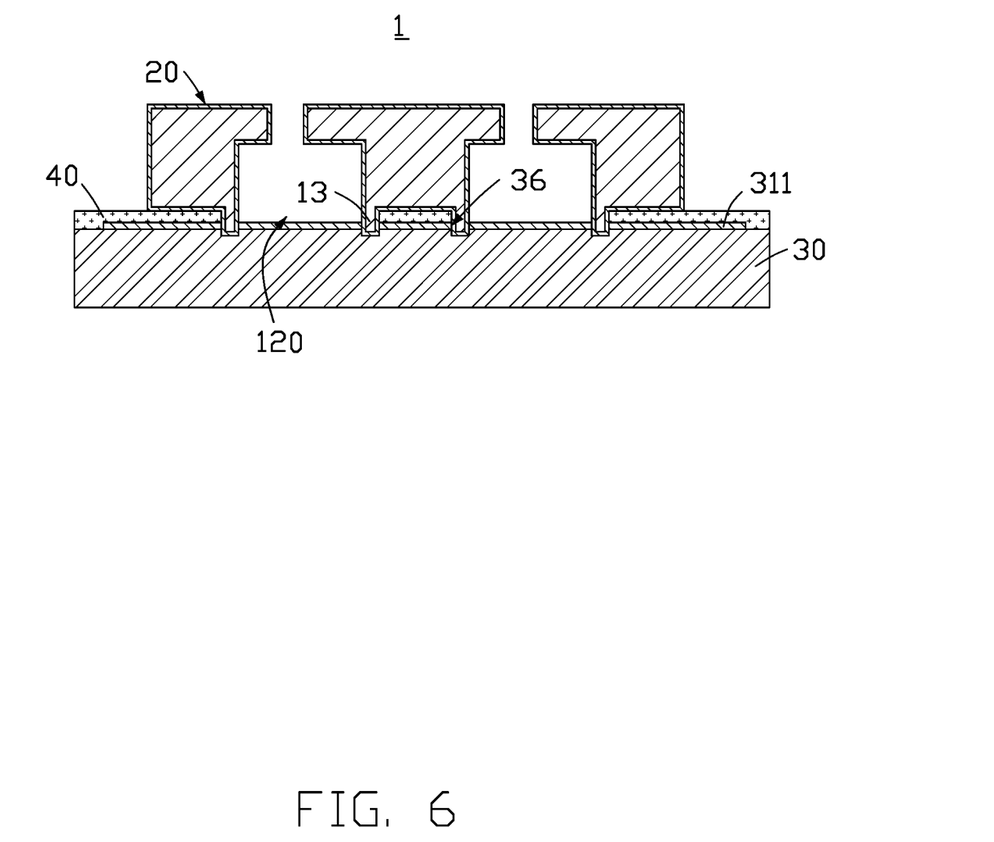
FIG. 6 is a diagrammatic view wherein a conductive plate and a circuit board are connected in yet another embodiment.

In yet another embodiment, as shown in FIG. 6, a slot 36 can also be defined at least in the first outer circuit layer 311 by laser cutting or etching. The slot 36 does not need to penetrate the circuit board 30. Then, the positioning pillar 13 of the conductive plate 20 is inserted into the slot 36, and the conductive plate 20 is adhered to the circuit board 30 through the adhesive layer 40. When the first outer circuit layer 311 has closed the opening 120, the material of the adhesive layer 40 is not limited to conductive material.

Figure 7:
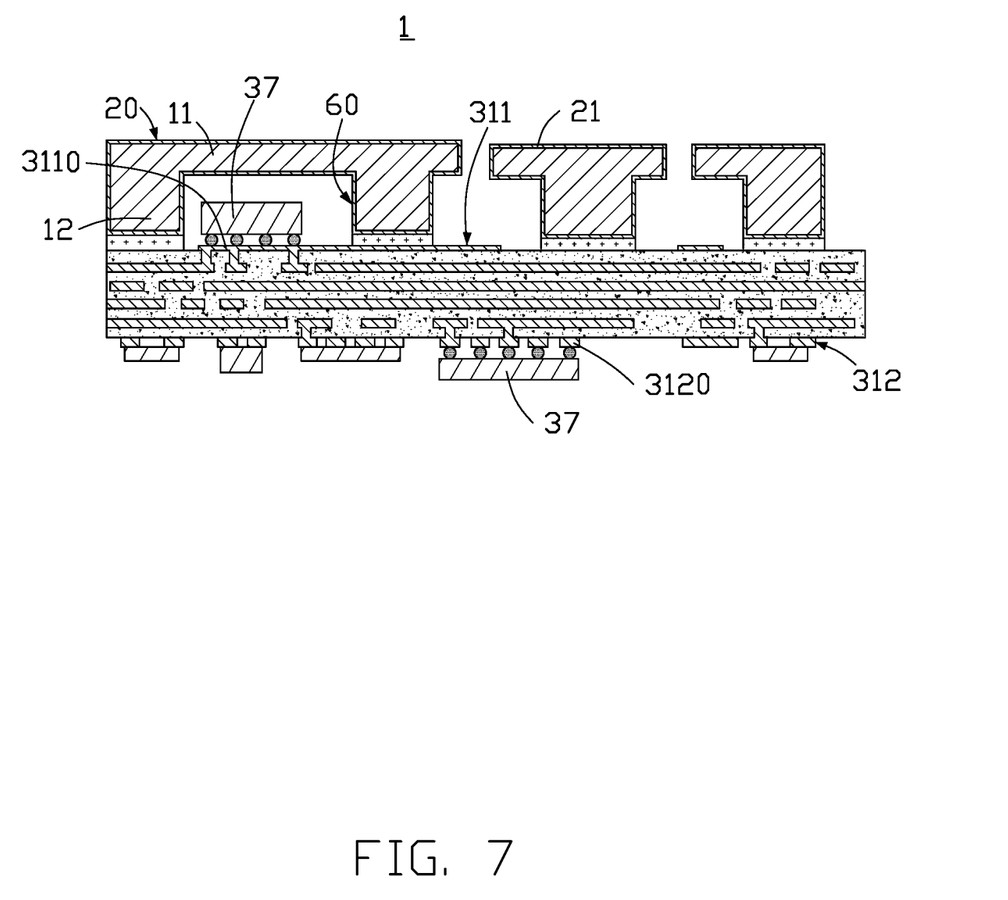
FIG. 7 is a diagrammatic view wherein a conductive plate and a circuit board are connected in yet another embodiment.

In yet another embodiment, as shown in FIG. 7, the first outer circuit layer 311 may include a plurality of first connection pads 3110. The second outer circuit layer 312 may include a plurality of second connection pads 3120. The circuit board 30 also includes a plurality of electronic components 37 that can be mounted on the first connection pad 3110 and the second connection pad 3120. The other two adjacent sidewalls 12 of the conductive plate 20 and the top wall 11 between the two sidewalls 12 further cooperatively constitute a receiving structure 60.

In such case, in step S14, when the conductive plate 20 is bonded to the first outer circuit layer 311, the receiving structure 60 of the conductive plate 20 can receive the electronic components 37 on the first connection pad 3110 therein. The receiving structure 60 and the conductive layer 21 on the inner surface of the receiving structure 60 form an electromagnetic shield.

Figure 13:
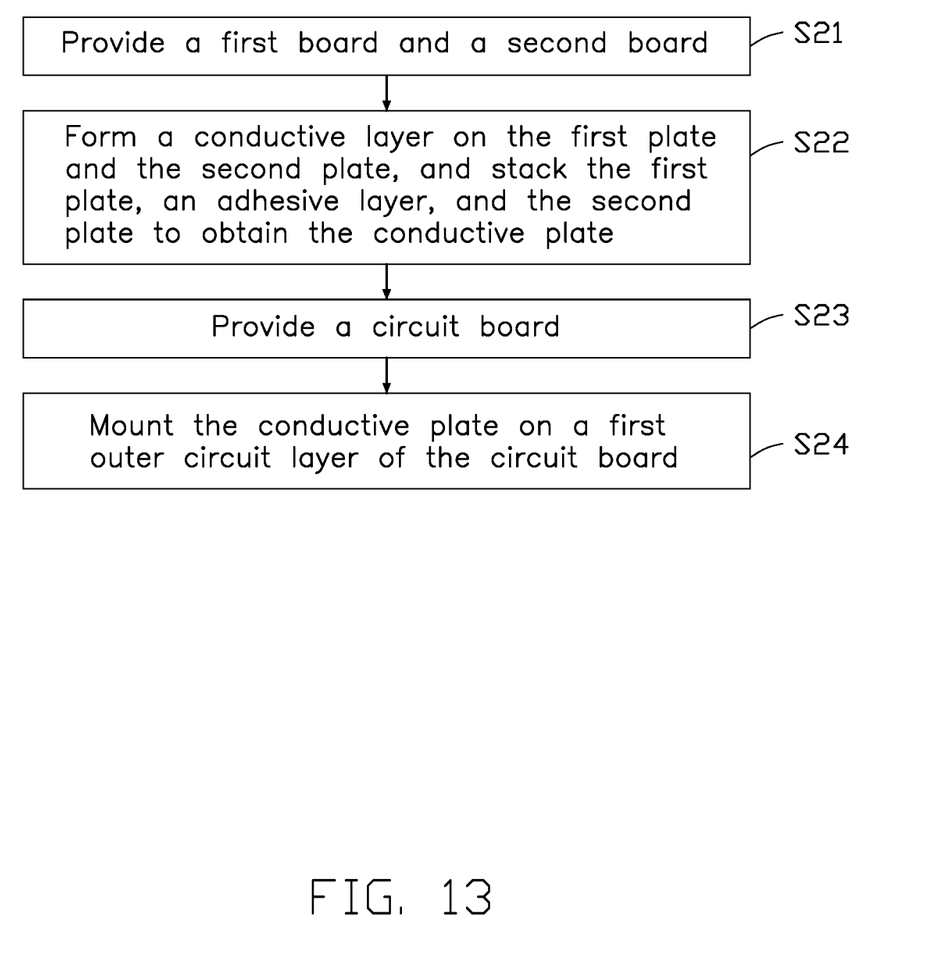
FIG. 13 is a flowchart of another embodiment of a method for manufacturing a circuit board structure according to the present disclosure.

Referring to FIG. 13, a method for manufacturing a circuit board structure 2 is presented in accordance with another embodiment. The method is provided by way of example, as there are a variety of ways to carry out the method. The method can begin at S21.

Figure 9:
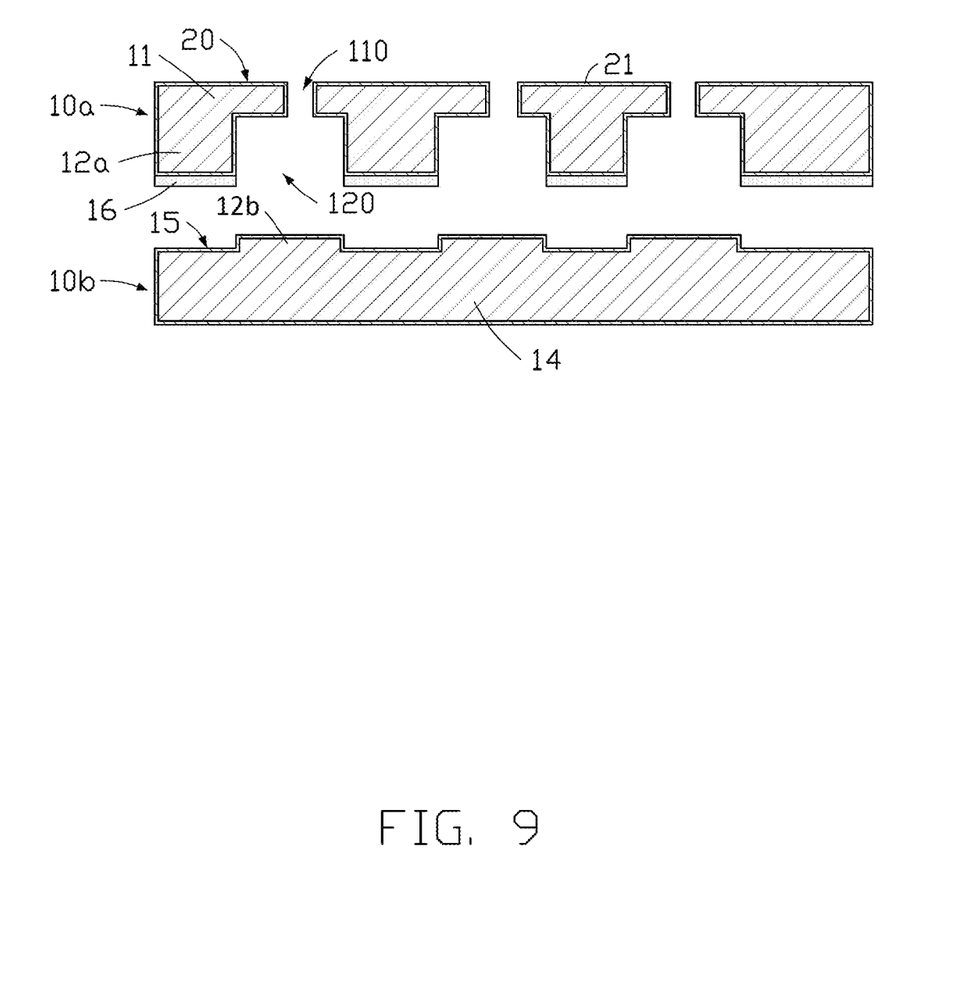
FIGS. 9 to 11 are diagrammatic views of another embodiment of a method for manufacturing a circuit board structure according to the present disclosure.

Step S21, referring to FIG. 9, a first board 10a and a second board 10b are provided.

The first plate 10a includes a top wall 11 and a plurality of first sidewalls 12a disposed on a same surface of the top wall 11. The top wall 11 defines a plurality of notches 110, and each notch 110 communicates with a space between two adjacent first sidewalls 12a. An opening 120 is defined between ends of two adjacent first sidewalls 12a away from the top wall 11.

The second plate 10b includes a bottom wall 14 and a plurality of second sidewalls 12b disposed on a same surface of the bottom wall 14. A groove 15 is defined between two adjacent second sidewalls 12b.

Figure 10:
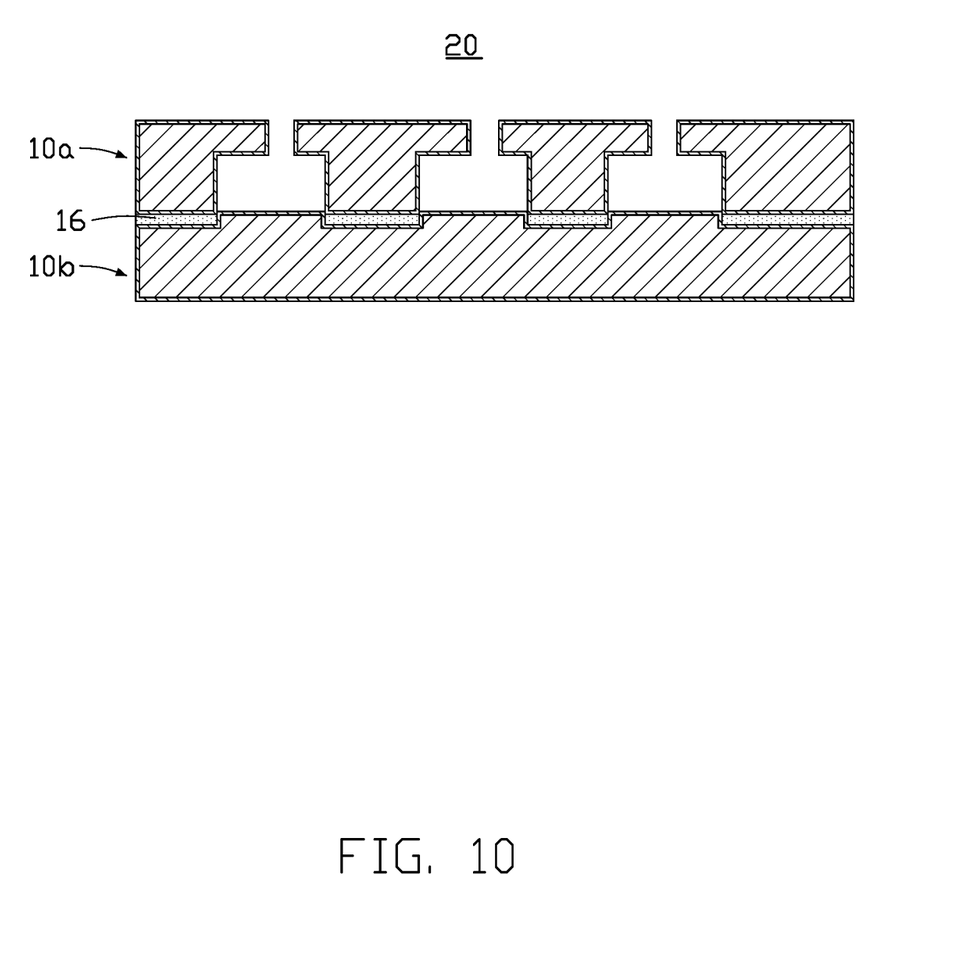

Step S22, referring to FIGS. 9 and 10, a conductive layer 21 is formed on the first plate 10a and the second plate 10b. Then, the first plate 10a with the conductive layer 21, an adhesive layer 16, and the second plate 10b with the conductive layer 21 are stacked in that order, so that the ends of the first sidewalls 12a away from the top wall 11 are bonded in the grooves 15 through the adhesive layer 16 (that is, the second sidewalls 12b extend into the openings 120) to obtain the conductive plate 20.

In some embodiments, the adhesive layer 16 may be made of a conductive resin, a solder paste, or an insulating resin.

Step S23, referring to FIG. 3, the circuit board 30 is provided. The circuit board 30 includes a first outer circuit layer 311, a second outer circuit layer 312, and at least one inner circuit layer 313.

Figure 11:
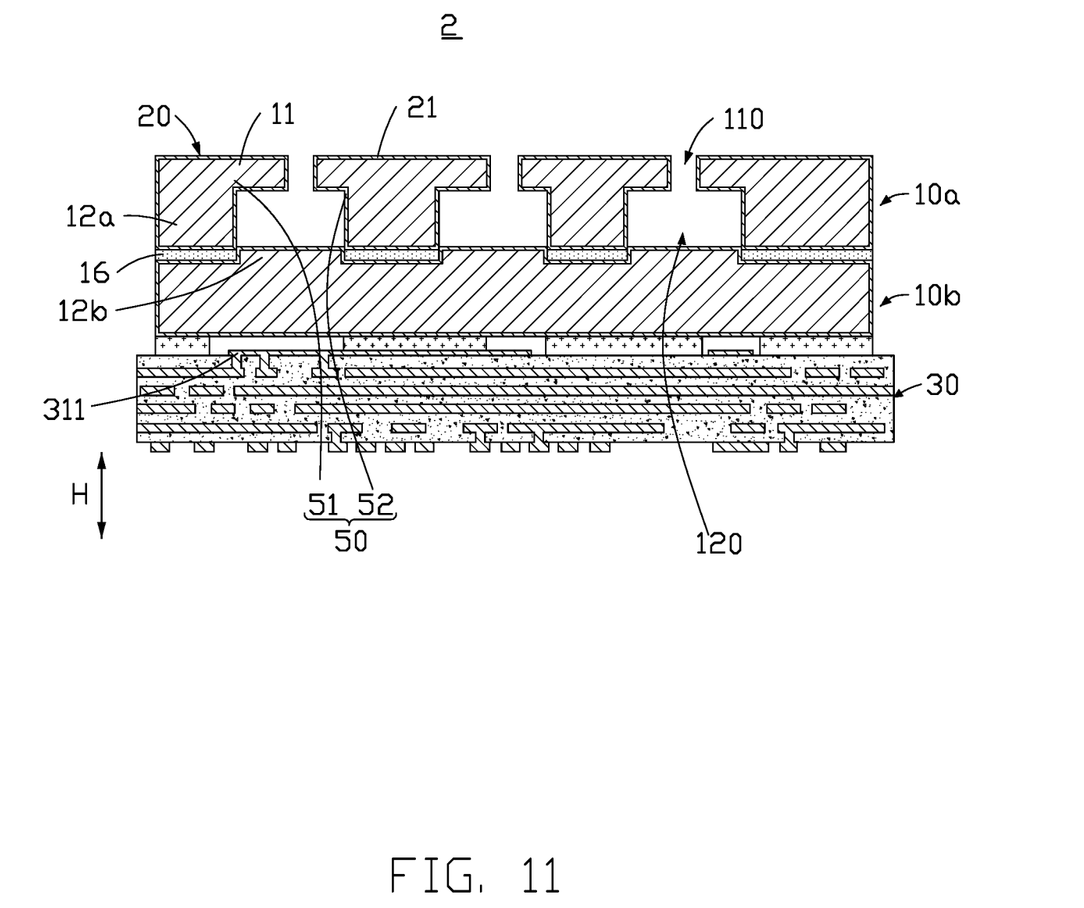

Step S24, referring to FIG. 11, the conductive plate 20 is mounted on the first outer circuit layer 311 by bonding or plugging, causing the notch 110 of the conductive plate 20 to face outward, thereby obtaining the circuit board structure 2.

The two adjacent first sidewalls 12a, the top wall 11 between the two first sidewalls 12a, and the second sidewall 12b between the two first sidewalls 12a cooperatively constitute a tube body 51 of the waveguide 50, and the conductive layer 21 on the inner surface of the tube body 51 constitutes a shielding layer 52 of the waveguide 50. Since the second sidewall 12b closes the opening 120 between the two first sidewalls 12a, the electromagnetic waves propagating in the waveguide 50 can be prevented from leaking out through the junction of the first plate 10a and the second plate 10b. Therefore, the material of the adhesive layer 16 is not limited to a conductive material.

The center axis of the notch 110 of each waveguide 50 can be along the thickness direction H of the circuit board 30.

Figure 12:
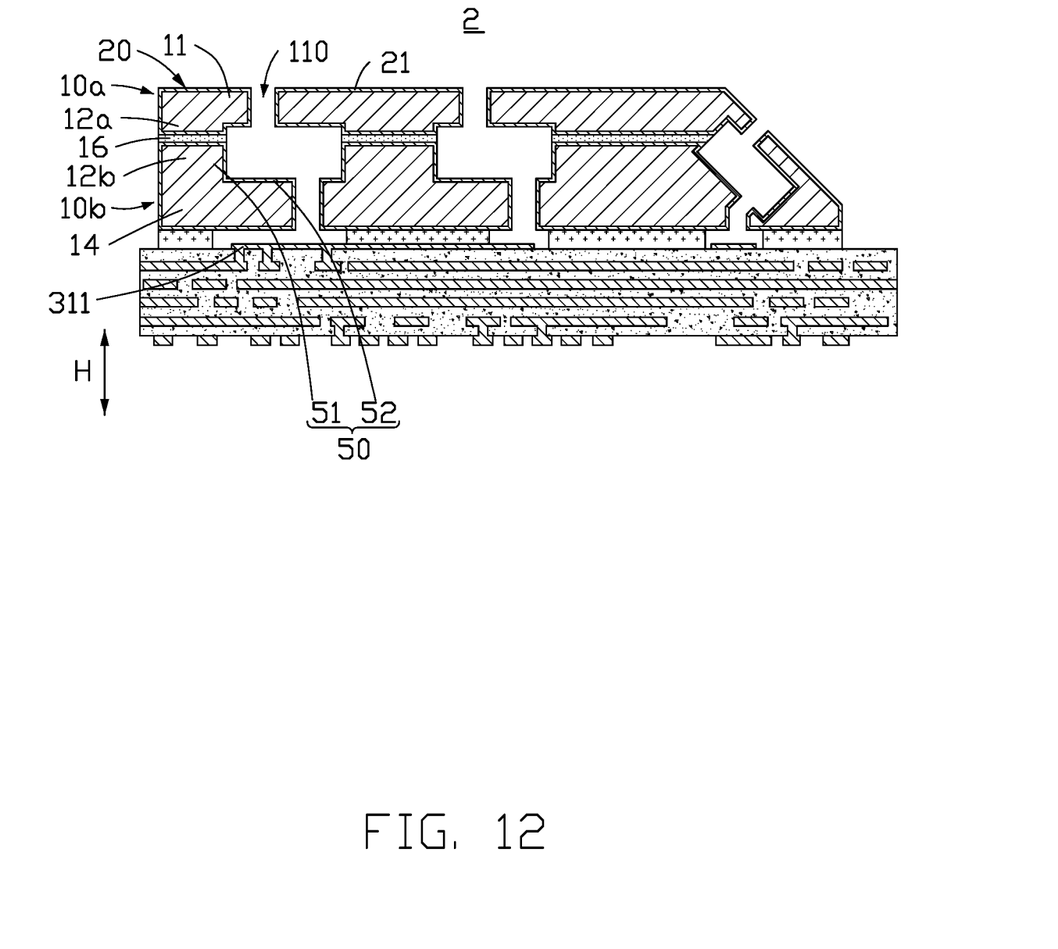
FIG. 12 is a diagrammatic view wherein a conductive plate and a circuit board are connected in another embodiment.

In other embodiments, referring to FIG. 12, the bonding method of the first plate 10a and the second plate 10b can also be changed. For example, when the first board 10a and the second board 10b are bonded together, the adhesive layer 16 can be used to bond to the first sidewall 12a of the first board 10 and the second sidewall 12b of the second board 10b. Therefore, a conductive plate 20 of another structure is obtained. In such case, two adjacent first sidewalls 12a, a top wall 11 between the two first sidewalls 12a, two adjacent second sidewalls 12b, and a bottom wall 14 between the two second sidewalls 12b cooperatively constitute the tube body 51 of the waveguide 50, and the conductive layer 21 on the inner surface of the tube body 51 forms the shielding layer 52 of the waveguide 50. In order to prevent the electromagnetic waves from leaking out through the junction of the first sidewall 12a and the second sidewall 12b, the adhesive layer 16 may be made of a conductive material.

The central axis of a portion of the notches 110 is along the thickness direction H of the circuit board 30, while the central axis of the other portion of the notches 110 is inclined with respect to the thickness direction H of the circuit board 30. Thus, the notches 110 of different waveguides 50 may have different orientations, so that the electromagnetic waves transmitted in the waveguides 50 can radiate outward in different directions, or the waveguides 50 can receive reflected electromagnetic waves in different directions.

In the method of the present disclosure, the plate 10 is formed by injection molding or die casting, and then a conductive layer 21 is formed on the plate 10 to form the conductive plate 20. The conductive plate 20 and the circuit board 30 are combined to obtain the circuit board structure 1 or 2 with the waveguide 50. The conductive layer 21 can prevent signal leakage. There is no need to define two arrays of metallic through holes in the waveguide, thereby simplifying the process and reducing the cost. Since the medium in the waveguide 50 is air, the electromagnetic waves propagate in the air has lower transmission loss.

Referring to FIGS. 4 to 7, an embodiment of a circuit board structure 1 is provided, which includes a circuit board 30. The circuit board 30 includes a first outer circuit layer 311, a second outer circuit layer 312, and at least one inner circuit layer 313. The circuit board structure 1 further includes a conductive plate 20 mounted on the first outer circuit layer 311. The conductive plate 20 includes a plate 10 and a conductive layer 21 disposed on the plate 10. The plate 10 includes a top wall 11 and a plurality of sidewalls 12 disposed on a same surface of the top wall 1. An opening 120 is defined between the ends of the two adjacent sidewalls 12 far away from the top wall 11. The first outer circuit layer 311 is disposed on the opening 120.

The two adjacent sidewalls 12, the top wall 11 between the two sidewalls 12, and the circuit board 30 between the two sidewalls 12 cooperatively constitute a tube body 51 of a waveguide 50, and the conductive layer 21 and the first outer circuit layer 311 on the inner surface of the tube body 51 cooperatively constitute a shielding layer 52 of the waveguide 50.

Referring to FIGS. 11 to 12, another embodiment of a circuit board structure 2 is also provided, which includes a circuit board 30. The circuit board 30 includes a first outer circuit layer 311, a second outer circuit layer 312, and at least one inner circuit layer 313. The circuit board structure 2 further includes a conductive plate 20 mounted on the first outer circuit layer 311. The conductive plate 20 includes a first plate 10a, a second plate 10b, and a conductive layer 21 disposed on the first plate 10a and the second plate 10b. An opening 120 is defined between the ends of two adjacent first sidewalls 12a away from the top wall 11. The second plate 10b is disposed on the opening 120.

The two adjacent first sidewalls 12a, the top wall 11 between the two first sidewalls 12a, and the second plate 10b between the two first sidewalls 12a cooperatively constitute a tube body 51 of the waveguide 50, and the conductive layer 21 on the inner surface of the tube body 51 constitutes a shielding layer 52 of the waveguide 50.

Even though information and advantages of the present embodiments have been set forth in the foregoing description, together with details of the structures and functions of the present embodiments, the disclosure is illustrative only. Changes may be made in detail, especially in matters of shape, size, and arrangement of parts within the principles of the present embodiments to the full extent indicated by the plain meaning of the terms in which the appended claims are expressed.

What is claimed is:

1. A method for manufacturing a circuit board structure with a waveguide, the method comprising:
   forming a plate of thermoplastic polymer by injection molding or die casting, the plate comprising a top wall and a plurality of sidewalls disposed on a same surface of the top wall, an opening being defined between ends of two adjacent of the plurality of sidewalls away from the top wall;
   forming a conductive layer on the plate to obtain a conductive plate, wherein the conductive layer at least covers an inner surface of the top wall facing the opening and inner surfaces of the two adjacent of the plurality of sidewalls facing the opening;
   providing a circuit board, the circuit board comprising an outer circuit layer, wherein the circuit board defines a plurality of conductive holes, the end of each of the plurality of sidewalls away from the top wall comprises a positioning pillar;
   inserting the positioning pillar of each of the plurality of sidewalls into a corresponding one of the plurality of conductive holes, thereby mounting the conductive plate on the outer circuit layer, and causing the outer circuit layer to be disposed on the opening, wherein the two adjacent sidewalls, the top wall between the two adjacent sidewalls, and the circuit board between the two adjacent sidewalls constitute a tube body of the waveguide, and the conductive layer and the outer circuit layer on an inner surface of the tube body cooperatively constitute a shielding of the waveguide.

2. The method of claim 1, wherein the conductive layer is formed by electroplating, chemical vapor deposition, or printing.

3. The method of claim 1, wherein the outer circuit layer comprises a connection pad;
   other two adjacent of the plurality of sidewalls of the conductive plate and the top wall between the two adjacent sidewalls also cooperatively define a receiving structure,
   the method further comprises:
   mounting an electronic component on the connection pad, causing the electronic component to be received in the receiving structure, wherein the receiving structure and the conductive layer on an inner surface of the receiving structure define an electromagnetic shield.

4. A method for manufacturing a circuit board structure with a waveguide, the method comprising:
   providing a first plate and a second plate, at least one of the first plate and the second plate being made of thermoplastic polymer and formed by injection molding or die casting, the first plate comprising a top wall and a plurality of first sidewalls disposed on a same surface of the top wall, an opening being defined between ends of two adjacent of the plurality of sidewalls away from the top wall;
   forming a conductive layer on first plate and the second plate, wherein the conductive layer at least covers an inner surface of the top wall facing the opening and inner surfaces of the two adjacent of the plurality of sidewalls facing the opening;
   stacking the first plate with the conductive layer, an adhesive layer, and the second plate with the conductive layer together, causing the second plate to be on the opening, thereby obtaining a conductive plate;

providing a circuit board, the circuit board comprising an outer circuit layer;

mounting the conductive plate on the outer circuit layer, causing the second plate to be located between the first plate and the outer circuit layer, wherein the two adjacent first sidewalls, the top wall between the two adjacent first sidewalls, and the second plate between the two adjacent first sidewalls constitute a tube body of the waveguide, and the conductive layer on an inner surface of the tube constitutes a shielding layer of the waveguide.

5. The method of claim 4, wherein the top wall defines a plurality of notches, and each of the plurality of notches is connected to a space between the two adjacent first sidewalls.

6. The method of claim 5, wherein a central axis of each of the plurality of notches is along a thickness direction of the circuit board.

7. The method of claim 5, wherein a central axis of a portion of the plurality of notches is along a thickness direction of the circuit board, and a central axis of the other portion of the plurality of notches is inclined with respect to the thickness direction.

8. The method of claim 4, wherein the conductive layer is formed by electroplating, chemical vapor deposition, or printing.

9. The method of claim 4, wherein at least one of the first plate and the second plate is made of a thermoplastic polymer.

10. A circuit board structure with a waveguide, comprising:

a circuit board comprising an outer circuit layer, the circuit board defining a plurality of conductive holes;

a conductive plate mounted on the outer circuit layer, the conductive plate comprising a plate and a conductive layer disposed on the plate, the plate made of thermoplastic polymer and comprising a top wall and a plurality of sidewalls disposed on a same surface of the top wall, an opening being formed between ends of two adjacent of the plurality of sidewalls away from the top wall, the conductive layer at least covering an inner surface of the top wall facing the opening and inner surfaces of the two adjacent of the plurality of sidewalls facing the opening, the outer circuit layer disposed on the opening, the end of each of the plurality of sidewalls away from the top wall comprising a positioning pillar, and each positioning pillar being inserted into a corresponding one of the plurality of conductive holes;

wherein the two adjacent sidewalls, the top wall between the two adjacent sidewalls, and the circuit board between the two adjacent sidewalls constitute a tube body of the waveguide, and the conductive layer and the outer circuit layer on an inner surface of the tube body constitute a shielding of the waveguide.

11. The circuit board structure of claim 10, wherein the outer circuit layer comprises a connection pad, the circuit board structure further comprises an electronic component mounted on the connection pad;

other two adjacent of the plurality of sidewalls of the conductive plate and the top wall between the two adjacent sidewalls also cooperatively define a receiving structure, the electronic component is received in the receiving structure, the receiving structure and the conductive layer on an inner surface of the receiving structure form an electromagnetic shield.

* * * * *